United States Patent
Tseng (10) Patent No.: US 7,929,296 B2
(45) Date of Patent: Apr. 19, 2011

(54) FASTENING DEVICE AND HEAT-DISSIPATING MODULE HAVING THE SAME

(75) Inventor: Chen Tseng, Kaohsiung (TW)

(73) Assignee: Quanta Computer Inc., Kuei Shan Hsiang, Tao Yuan Shien (TW)

( * ) Notice: Subject to any disclaimer, the term of this patent is extended or adjusted under 35 U.S.C. 154(b) by 163 days.

(21) Appl. No.: 12/385,256

(22) Filed: Apr. 2, 2009

(65) Prior Publication Data

US 2009/0301689 A1   Dec. 10, 2009

(30) Foreign Application Priority Data

Jun. 4, 2008 (TW) ................................ 97209829 U (51) Int. Cl.
*H05K 7/20* (2006.01)
*H01L 23/40* (2006.01)

(52) U.S. Cl. ............. 361/679.52; 361/679.47; 361/696; 361/701; 361/719; 165/80.3; 165/104.33; 165/121; 165/185

(58) Field of Classification Search ....... 361/679.46–55, 361/690–697, 700–712, 715–724; 257/706–727; 165/80.2, 80.3, 80.4, 104.33, 104.34, 121–126, 165/185; 174/15.1, 16.3, 252; 411/511, 516, 530; 24/482, 485, 539, 545–547, 555, 568, 625, 981; 248/316.7, 505, 510

See application file for complete search history.

(56) References Cited

U.S. PATENT DOCUMENTS

| 6,865,082 | B2 * | 3/2005 | Huang et al. | 361/700 |
| 7,126,824 | B2 * | 10/2006 | Lee et al. | 361/704 |
| 7,400,507 | B2 * | 7/2008 | Wang et al. | 361/719 |
| 7,766,691 | B2 * | 8/2010 | Pandey et al. | 439/487 |
| 2007/0236887 | A1 * | 10/2007 | Cheng et al. | 361/700 |

* cited by examiner

*Primary Examiner* — Michael V Datskovskiy
(74) *Attorney, Agent, or Firm* — Thomas, Kayden, Horstemeyer & Risley, LLP (57) ABSTRACT

The invention discloses a fastening device for fasten a heat sink onto a base board. The fastening device comprises a first fastening member, a second fastening member and a third fastening member. When assembling the fastening device to the base board, the second fastening member has to be pivoted with the third fastening member first. Afterwards, the first fastening member is attached to the base board. Finally, the second and third fastening members, which have been assembled, are engaged with the first fastening member, so as to press the heat sink tightly. Accordingly, the heat sink will be fastened on the base board easily and stably.

20 Claims, 10 Drawing Sheets

FASTENING DEVICE AND HEAT-DISSIPATING MODULE HAVING THE SAME

BACKGROUND OF THE INVENTION

1. Field of the Invention

The invention relates to a fastening device, and particularly, to a fastening device used for fastening a heat sink onto a base board.

2. Description of the Prior Art

With the rapid development of electronic technology in recent years, the developing trend of the electronic devices is toward the direction of miniaturization and high-density. The heat generated by the electronic component (e.g., the CPU in a computer) when it operates is gradually increased. If the heat can not be removed in time, the temperature inside the electronic component will increase which leads the normal operation of the electronic component being seriously affected. Presently, the heat-dissipater and the heat pipe are generally set on the electronic component to help the heat dissipation of the electronic device, and a fan is further set on the heat-dissipater to become a heat-dissipating apparatus. The heat in the heat-dissipater will be rapidly dissipated by the airflow generated by the fan when it operates, so that the heat generated by the electronic device will be also brought out.

Figure 1:
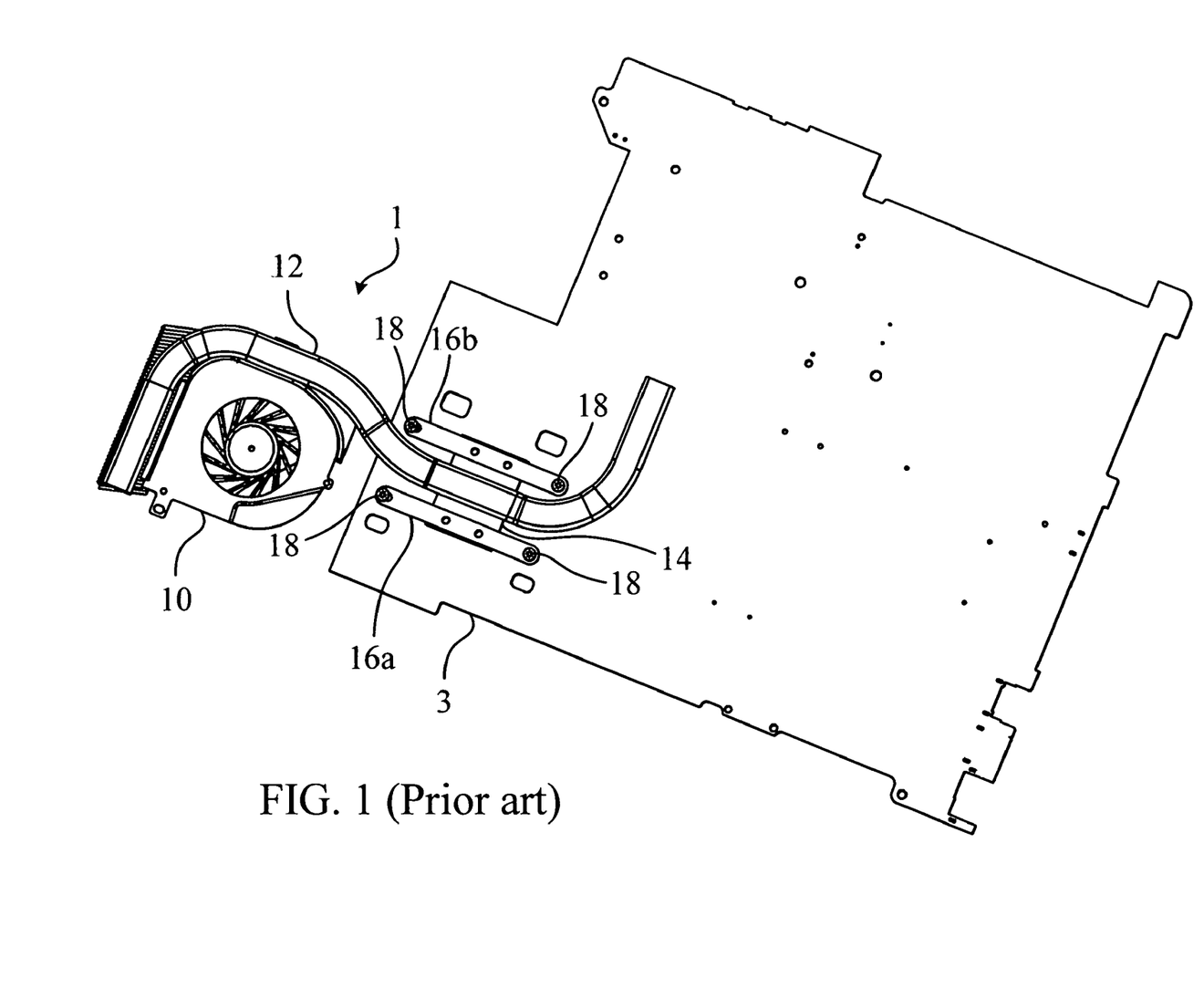
FIG. 1 shows a schematic diagram of the heat-dissipating module in the prior art.

Please refer to FIG. 1. FIG. 1 shows a schematic diagram of a heat-dissipating module 1 in the prior art. The heat-dissipating module 1 comprises a fan 10, a heat pipe 12, and a heat sink 14. When fabricating, a CPU (not shown in FIG. 1) is firstly set on a base board 3 in FIG. 1. Then, the heat sink 14 is set on the CPU to conduct the heat generated by the CPU when it operates. It should be noticed that two plank members 16a and 16b are welded on the two sides of the heat sink 14 respectively. Afterward, the screws 18 are used to fix the plank members 16a and 16b on the base board 3. At last, one section of the heat pipe 12 is welded on the heat sink 14. By doing so, the heat generated by the CPU when it operates can be conducted to the exit of the fan 10 via the heat sink 14 and the heat pipe 12. And, the heat will be further dissipated rapidly by the airflow generated by the fan 10 when it operates.

However, in the fabrication process of the heat-dissipating module 1 in the prior art, it is complicated to fix the plank members 16a and 16b on the base board 3 by the screws 18 respectively by hands. Moreover as shown in FIG. 1, the heat sink 14 comprises two plank members 16a, 16b and four screws 18, thus, the number of components is large and the cost of the components is increased relatively.

Therefore, the invention provides a simple fastening device to solve the above-mentioned problems.

SUMMARY OF THE INVENTION

The scope of the invention is to provide a fastening device used for fastening a heat sink onto a base board. The base board has a first surface, a second surface, and at least two holes. In an embodiment according to the invention, the fastening device comprises a first fastening member, a second fastening member, and a third fastening member.

The first fastening member has at least two first engaging parts. The first fastening member is disposed on the first surface to make each of the first engaging parts embedded into the corresponding hole on the base board and exposed out of the second surface.

The second fastening member is disposed on the second surface. The second fastening member has a first side member, a second side member adjacent to the first side member, a third side member opposite to the second side member, and a fourth side member opposite to the first side member. The first side member has a second engaging part engaged with the corresponding first engaging part on the first fastening member. The second side member has a first pivoting hole; the third side member has a second pivoting hole; and the fourth side member has a stopping part.

The third fastening member is disposed on the second surface. The third fastening member has a fifth side member, a sixth side member adjacent to the fifth side member, a seventh side member opposite to the sixth side member, and an eighth side member opposite to the fifth side member. The fifth side member has a third engaging part engaged with the corresponding first engaging part. The sixth side member has a first pivoting axle pivoted with the first pivoting hole on the second fastening member; the seventh side member has a second pivoting axle pivoted with the second pivoting hole on the second fastening member.

In this embodiment, when the second fastening member engages with the corresponding first engaging part via the second engaging part, and the third fastening member engages with the corresponding first engaging part via the third engaging part, the fourth side member of the second fastening member and the eighth side member of the third fastening member press the heat sink respectively. And, the stopping part of the second fastening member will limit the rotation of the third fastening member.

Therefore, when the fastening device of the invention is fabricated, it is only needed to assemble the second fastening member and the third fastening member together firstly, and then to engage the second fastening member and third fastening member with the first fastening member respectively. Compared to the prior art, the invention has the following advantages: (1) convenience of fabrication; (2) no screws used to save the cost of screws; (3) simpler structure and fewer assembling components.

The advantage and spirit of the invention may be understood by the following recitations together with the appended drawings.

DETAILED DESCRIPTION OF THE INVENTION

Figure 2:
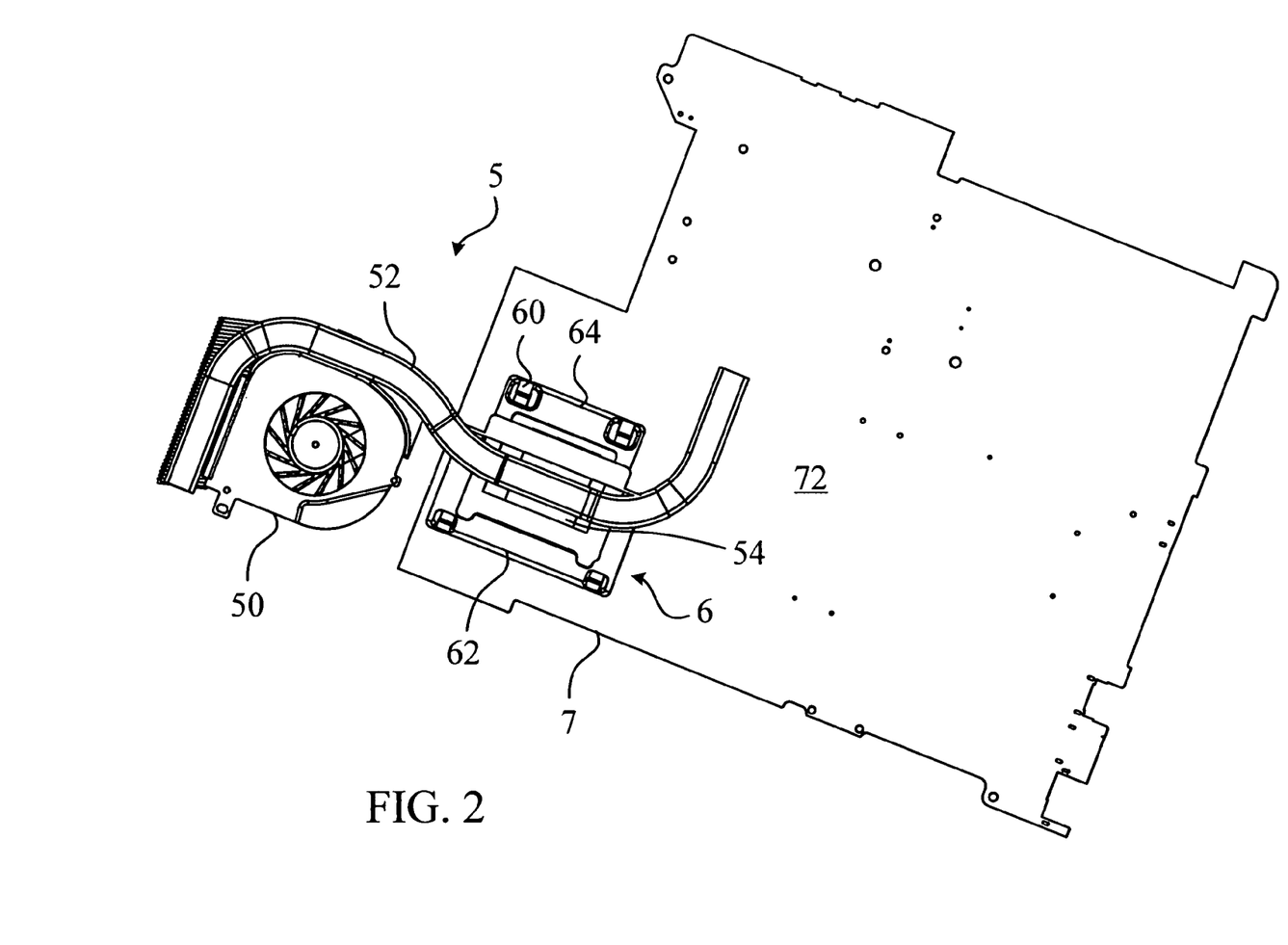
FIG. 2 shows a schematic diagram of the heat-dissipating module in an embodiment of the invention.
Figure 3:
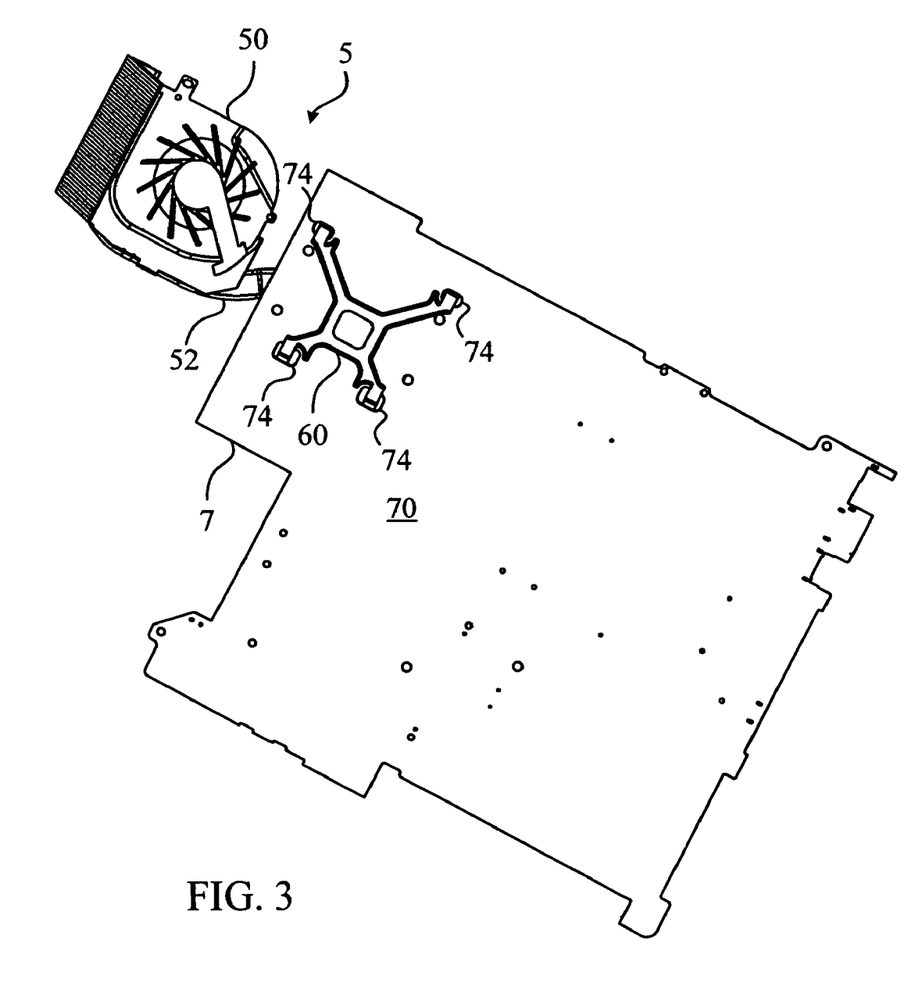
FIG. 3 shows a schematic diagram of the heat-dissipating module of FIG. 2 in another view angle.
Figure 4:
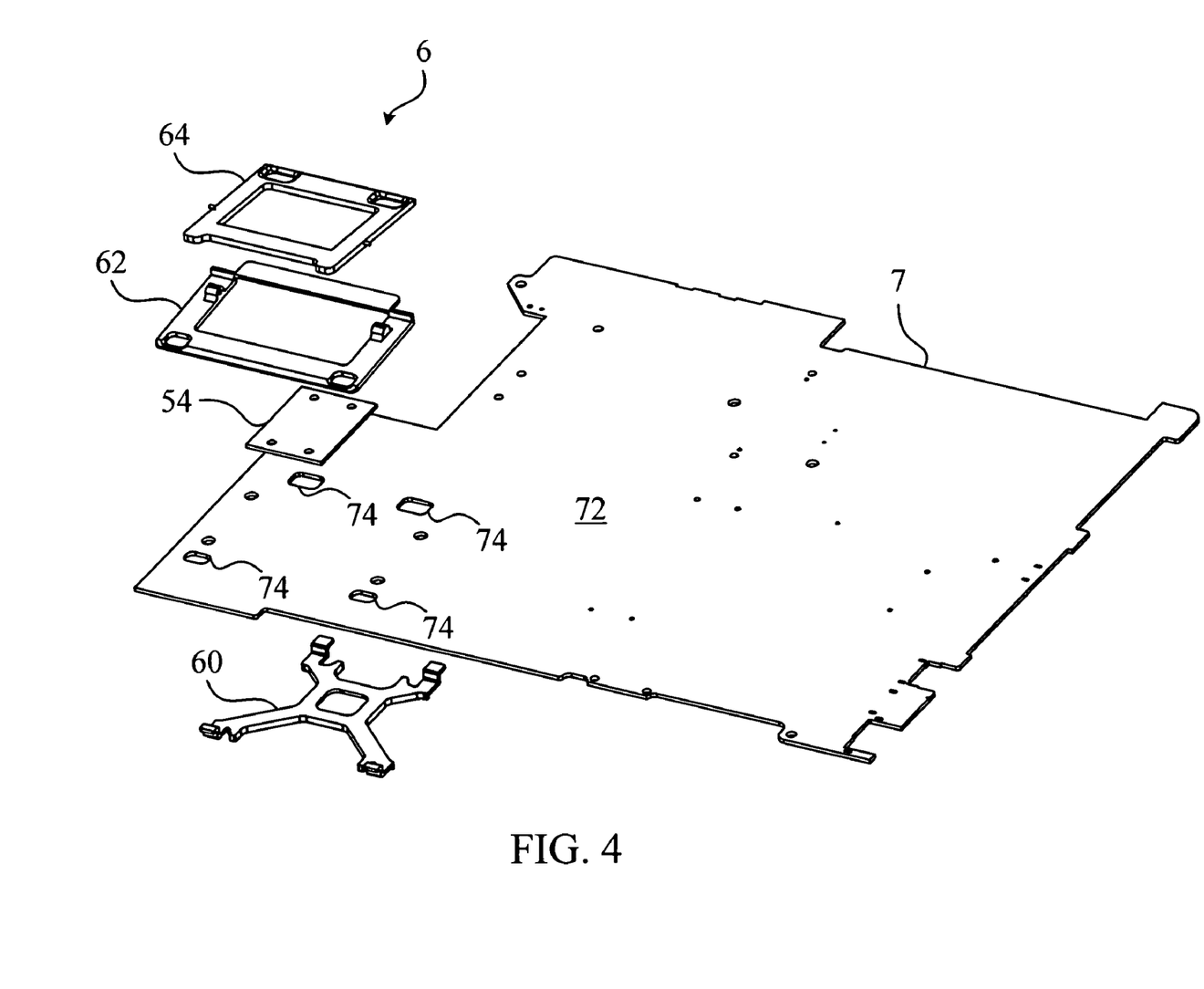
FIG. 4 shows an exploded diagram of the heat-dissipating module.

Please refer to FIG. 2 to FIG. 4. FIG. 2 shows a schematic diagram of the heat-dissipating module 5 in an embodiment of the invention. FIG. 3 shows a schematic diagram of the heat-dissipating module 5 of FIG. 2 in another view angle. FIG. 4 shows an exploded diagram of the heat-dissipating module 5. The heat-dissipating module 5 is suitable to be set in various electronic devices having heat-dissipating requirements, such as a computer or a projector. In general, the base board 7 shown in FIG. 2 to FIG. 4 will be set in the electronic devices, so that various electronic components (e.g., a CPU) can be set on the base board 7.

As shown in FIG. 2 to FIG. 4, the heat-dissipating module 5 comprises a fan 50, a heat pipe 52, and a heat sink 54. The fastening device 6 of the invention is used for fastening the heat sink 54 onto the base board 7. The fastening device 6 comprises a first fastening member 60, a second fastening member 62, and a third fastening member 64. The base board 7 has a first surface 70, a second surface 72, and four holes 74.

Figure 5:
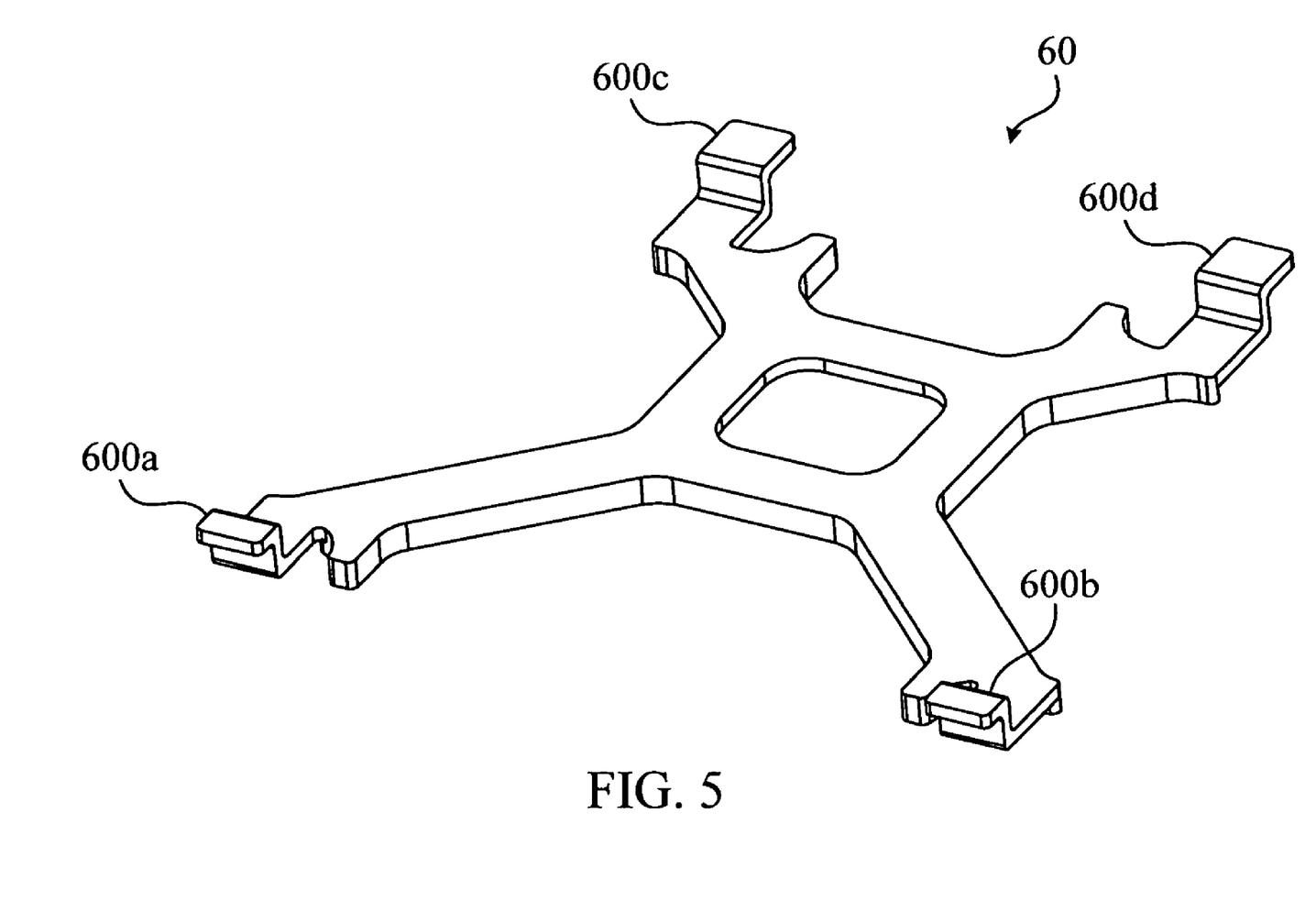
FIG. 5 shows an enlarging view of the first fastening member in FIG. 4.

Please refer to FIG. 5. FIG. 5 shows an enlarging view of the first fastening member 60 in FIG. 4. The first fastening member 60 comprises four first engaging parts 600a, 600b, 600c, and 600d. The first fastening member 60 is disposed on the first surface 70 of the base board 7 to make each of the first engaging parts 600a~600d embedded into the corresponding hole 74 on the base board 7 and exposed out of the second surface 72.

Figure 6:
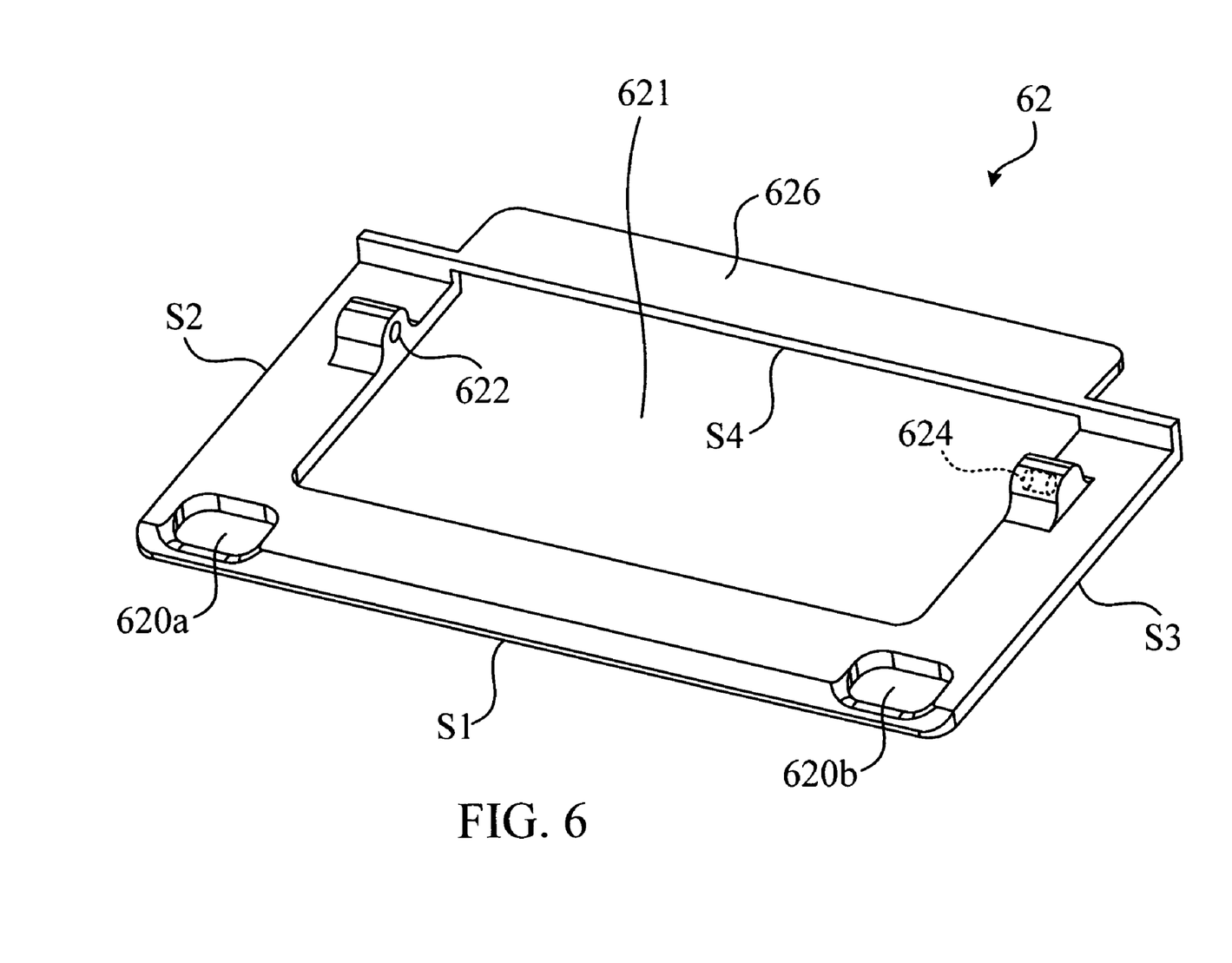
FIG. 6 shows an enlarging view of the second fastening member in FIG. 4.
Figure 8:
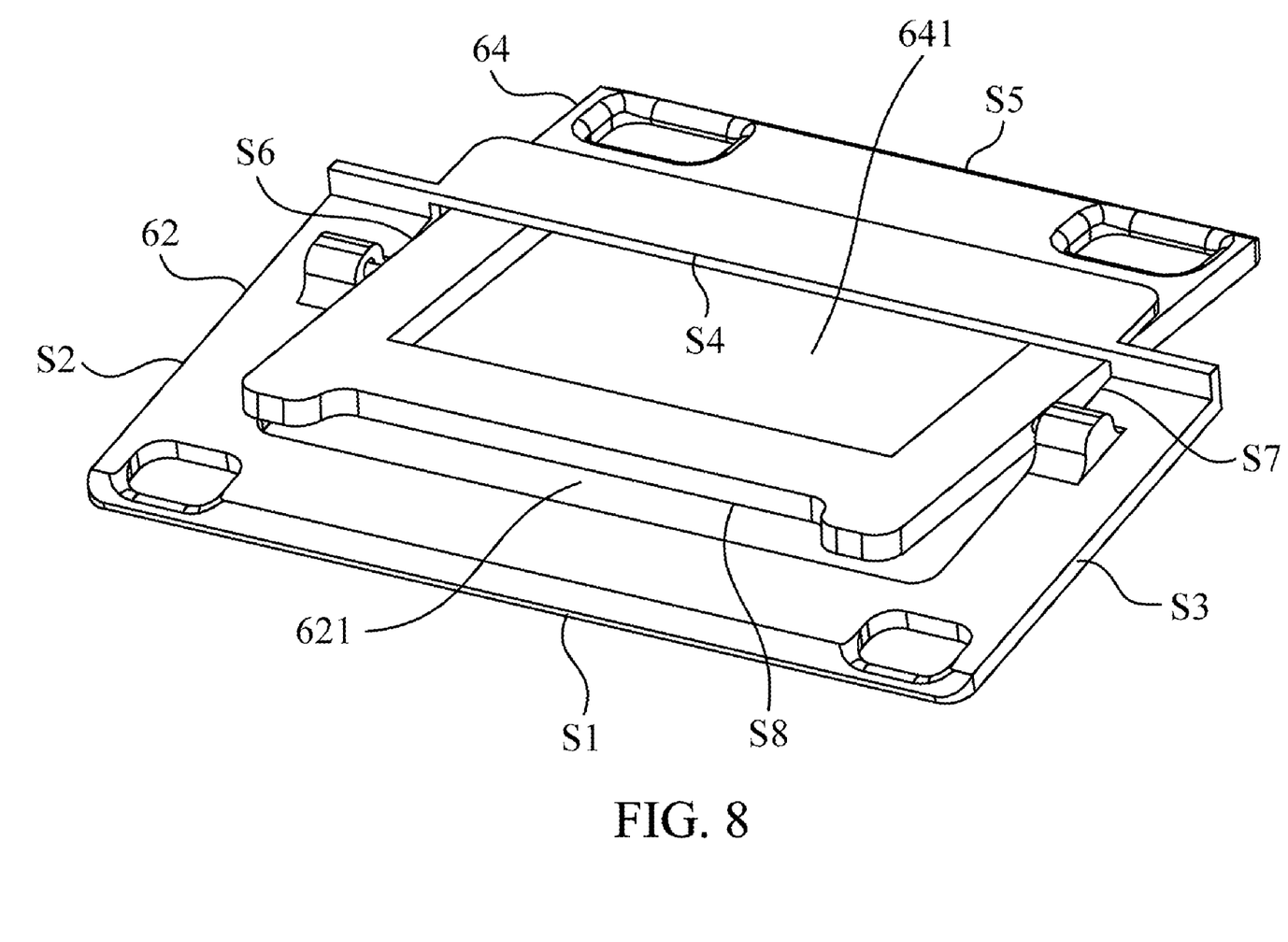
FIG. 8 shows a schematic diagram of assembling the second fastening member and the third fastening member.

Please refer to FIG. 6 and FIG. 8. FIG. 6 shows an enlarging view of the second fastening member 62 in FIG. 4. The second fastening member 62 has a first opening 621. A first side member S1, a second side member S2 adjacent to the first side member S1, a third side member S3 opposite to the second side member S2, and a fourth side member S4 opposite to the first side member S1 are respectively defined around the first opening 621. The first side member S1 has two second engaging parts 620a, 620b. The engaging parts 620a, 620b can engage with the two corresponding first engaging parts 600a, 600b on the first fastening member 60. The second side member S2 has a first pivoting hole 622; the third side member S3 has a second pivoting hole 624; and the fourth side member S4 has a stopping part 626. When assembling, the third fastening member 64 is pivoted to the second fastening member 62 through the first opening 621 to form an X type fastening structure, and then the heat pipe 52 can contact with the heat sink 54 directly.

Figure 7:
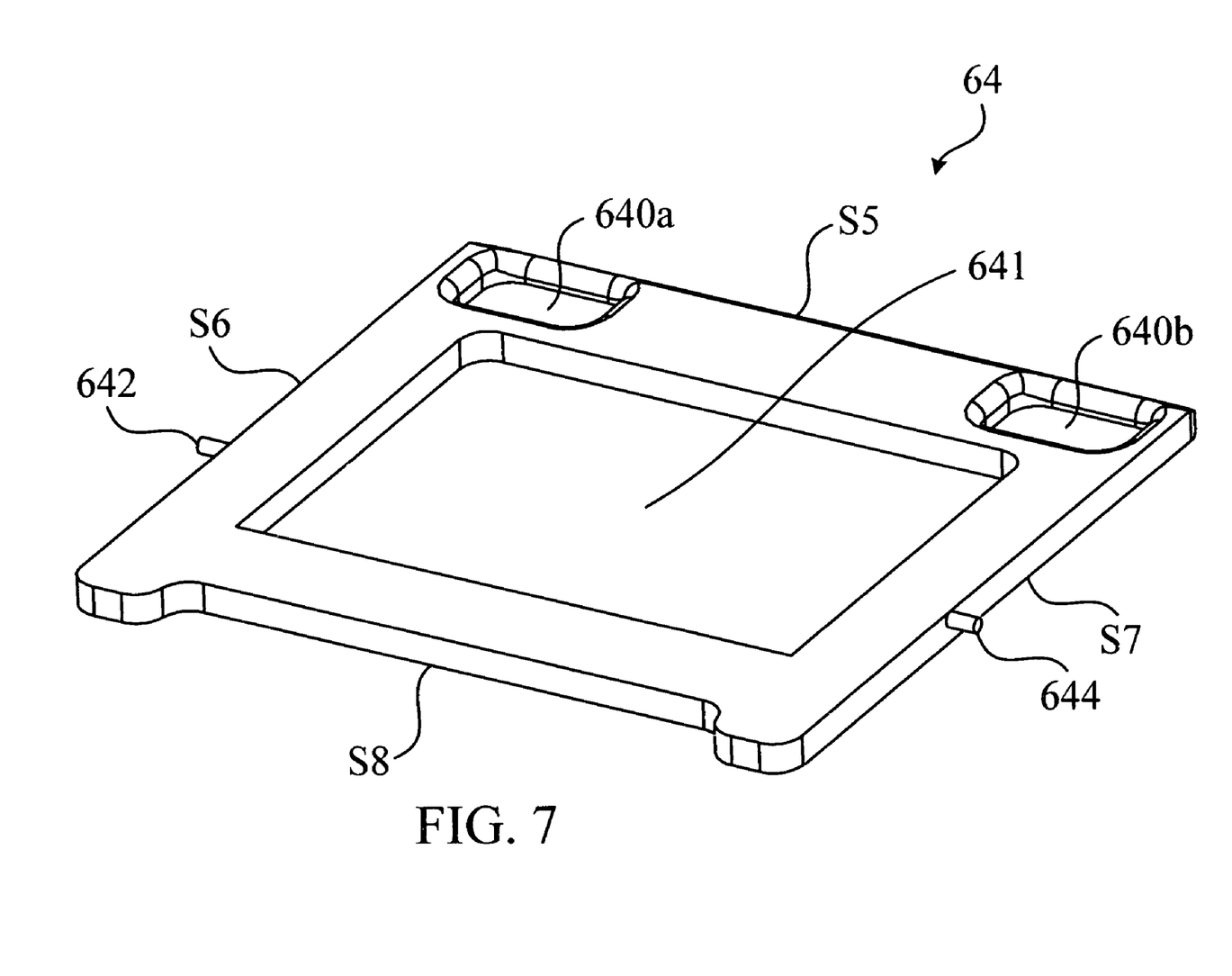
FIG. 7 shows an enlarging view of the third fastening member in FIG. 4.

Please refer to FIG. 7 and FIG. 8. FIG. 7 shows an enlarging view of the third fastening member 64 in FIG. 4. The third fastening member 64 has a second opening 641. A fifth side member S5, a sixth side member S6 adjacent to the fifth side member S5, a seventh side member S7 opposite to the sixth side member S6, and a eighth side member S8 opposite to the fifth side member S5 are respectively defined around the second opening 641. The fifth side member S5 has two third engaging parts 640a, 640b. The engaging parts 640a, 640b can engage with the two corresponding first engaging parts 600c, 600d on the first fastening member 60. The sixth side member S6 has a first pivoting axle 642. The first pivoting axle 642 can pivot with the first pivoting hole 622 on the second fastening member 62. The seventh side member S7 has a second pivoting axis 644. The second pivoting axle 644 can pivot with the second pivoting hole 624 on the second fastening member 62. The second opening 641 can make the heat pipe 52 to contact with the heat sink 54 directly.

Please refer to FIG. 8. FIG. 8 shows a schematic diagram of assembling the second fastening member 62 and the third fastening member 64. When assembling, the second fastening member 62 and the third fastening member 64 should be assembled together firstly. As shown in FIG. 8, the third fastening member 64 crosses the first opening 621 of the second fastening member 62 to pivot with the second fastening member 62 in an X type.

On the other hand, an electronic component (not shown in the figures) is set on the base board 7. Then, the heat sink 54 is set on the electronic device to conduct the heat generated by the electronic component when it operates by the heat sink 54. Afterward, the first fastening member 60 is assembling on the second surface 72 of the base board 7 as shown in FIG. 3. Then, the assembled second fastening member 62 and the third fastening member 64 will engage with the first engaging parts 600a, 600b, 600c, and 600d of the first fastening member 60 respectively.

In this embodiment, when the second fastening member 62 engages with the corresponding first engaging parts 600a and 600b on the first fastening member 60 via the second engaging parts 620a and 620b, and the third fastening member 64 engages with the corresponding first engaging parts 600c and 600d on the first fastening member 60 via the third engaging parts 640a and 640b. Both the fourth side member S4 of the second fastening member 62 and the eighth side member S8 of the third fastening member 64 will press the heat sink 54. And, the stopping part 626 of the second fastening member 62 will limit the rotation of the third fastening member 64. By doing so, the heat sink 54 can be firmly fixed.

Finally, one end of the heat pipe 52 is welded on the heat sink 54. By doing so, the heat generated by the electronic component when it operates can be conducted to the exit of the fan 50 via the heat sink 54 and the heat pipe 52. And, the heat will be further dissipated rapidly by the airflow generated by the fan 50 when it operates.

Figure 9:
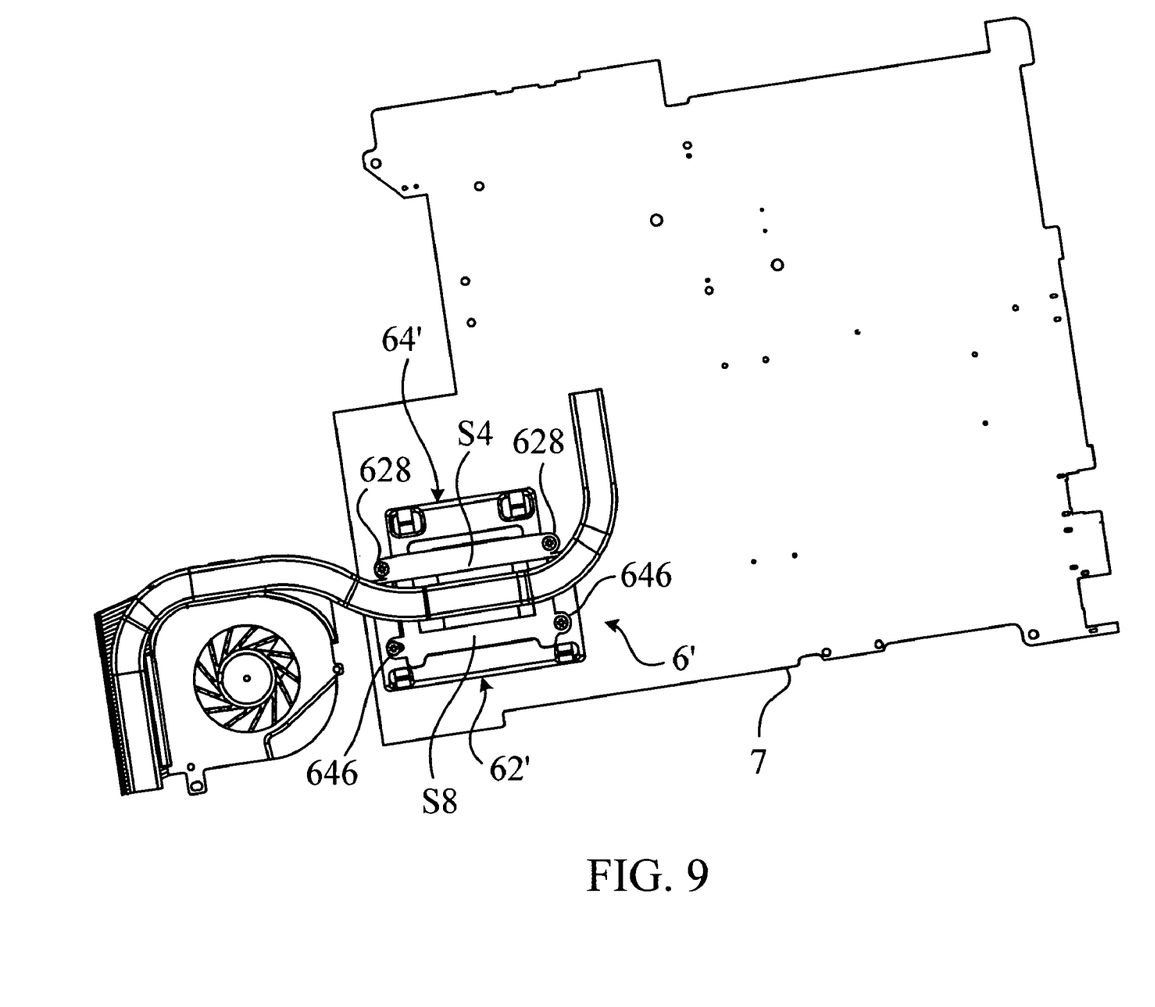
FIG. 9 shows a schematic diagram of assembling the fastening device on the base board in another embodiment of the invention.
Figure 10:
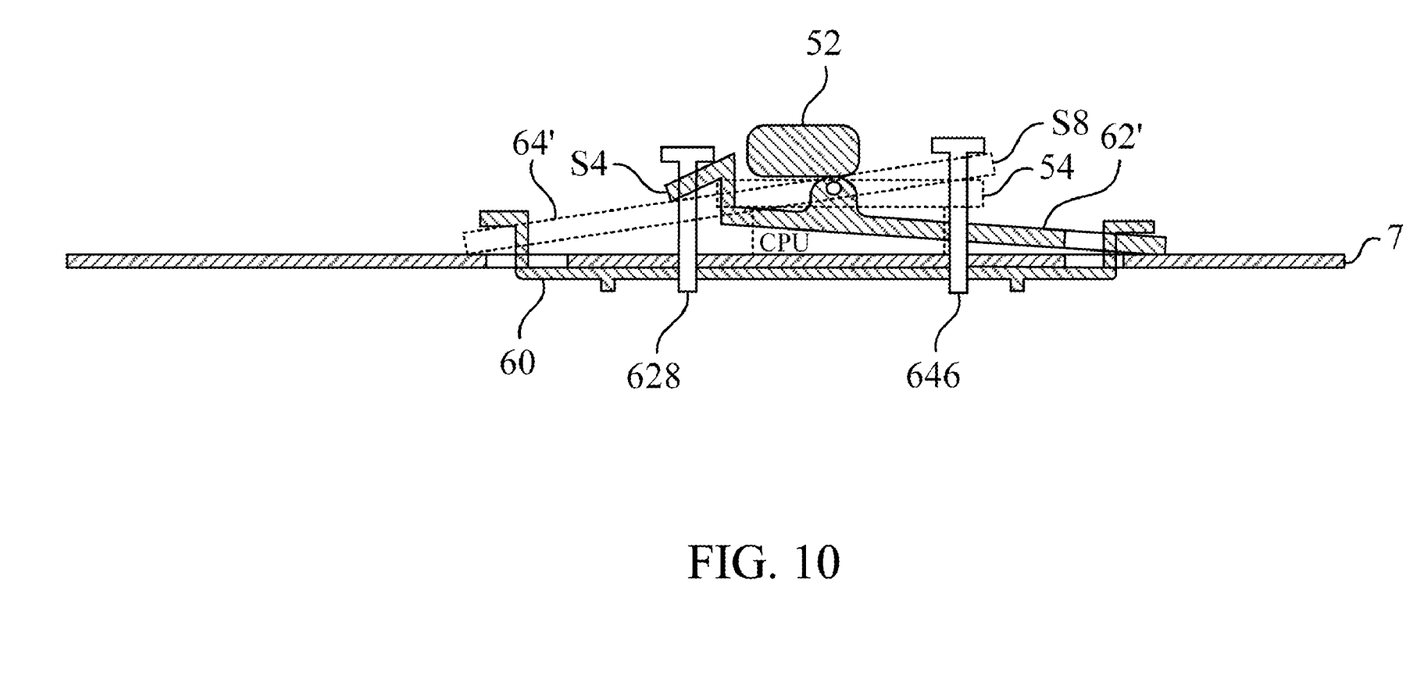
FIG. 10 shows a cross-sectional diagram of FIG. 9.

Please refer to FIG. 9 and FIG. 10. FIG. 9 shows a schematic diagram of assembling the fastening device 6' on the base board 7 in another embodiment of the invention. FIG. 10 shows a cross-sectional diagram of FIG. 9. As shown in FIG. 9, the structure of the second fastening member 62' is basically the same with that of the above-mentioned second fastening member 62. The main difference between them is that the fourth side member S4 of the second fastening member 62' further comprises a first fastening part 628 to lock with the base board 7. In addition, the structure of the third fastening member 64' is basically the same with that of the above-mentioned third fastening member 64. The main difference between them is that the eighth side member S8 of the third fastening member 64' further comprises a second fastening part 646 to lock with the base board 7.

In practical applications, the screws can be used to fix the first fastening part 628 of the second fastening member 62' and the second fastening part 646 of third fastening member 64' onto the base board 7, as shown in FIG. 9. In another embodiment, a riveting process, a welding process, or other process can be used to fix the first fastening part 628 of the second fastening member 62' and the second fastening part 646 of third fastening member 64' onto the base board 7. By doing so, the fastening device 6' of the invention can fix the heat sink 6' onto the base board 7 more firmly, so that the heat sink will be not separated from the base board 7 due to the collision.

Compared to the prior art, when the fastening device of the invention is fabricated, it is only needed to assemble the second fastening member and the third fastening member together firstly and then to engage the second fastening member and third fastening member with the first fastening member respectively. Compared to the prior art, the invention has the following advantages: (1) convenience of fabrication; (2) no screws used to save the cost of screw; (3) simpler structure and fewer assembling components.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A fastening device for fastening a heat sink onto a base board, the base board having a first surface, a second surface, and at least two holes, the fastening device comprising:

a first fastening member having at least four first engaging parts, the first fastening member being disposed on the first surface, each of the first engaging parts being embedded into the corresponding hole on the base board and being exposed out of the second surface;

a second fastening member disposed on the second surface, the second fastening member having a first side member, a second side member adjacent to the first side member, a third side member opposite to the second side member, and a fourth side member opposite to the first side member, the first side member having at least two second engaging parts engaged with the corresponding first engaging parts, the second side member having a first pivoting hole, the third side member having a second pivoting hole; and a third fastening member disposed on the second surface, the third fastening member having a fifth side member, a sixth side member adjacent to the fifth side member, a seventh side member opposite to the sixth side member, and an eighth side member opposite to the fifth side member, the fifth side member having at least two third engaging parts engaged with the corresponding first engaging parts, the sixth side member having a first pivoting axle pivoted with the first pivoting hole, the seventh side member having a second pivoting axle pivoted with the second pivoting hole;

wherein when the second fastening member engages with the corresponding first engaging parts via the second engaging parts, and the third fastening member engages with the corresponding first engaging parts via the third engaging parts, both the fourth side member of the second fastening member and the eighth side member of the third fastening member press the heat sink.

2. The fastening device of claim 1, wherein the fourth side member of the second fastening member has a first fastening part to lock with the base board.

3. The fastening device of claim 1, wherein the eighth side member of the third fastening member has a second fastening part to lock with the base board.

4. The fastening device of claim 1, wherein the second fastening member and the third fastening member are pivoted in an X type.

5. The fastening device of claim 4, wherein the fourth side member of the second fastening member has a stopping part, the stopping part limits the rotation of the third fastening member.

6. The fastening device of claim 1, wherein the second fastening member has a first opening.

7. The fastening device of claim 6, wherein the third fastening member crosses the first opening of the second fastening member to pivot with the second fastening member in an X type.

8. The fastening device of claim 7, wherein the fourth side member of the second fastening member has a stopping part, the stopping part limits the rotation of the third fastening member.

9. The fastening device of claim 8, wherein the third fastening member has a second opening.

10. The fastening device of claim 9, wherein the fourth side member of the second fastening member has a first fastening part to lock with the base board.

11. The fastening device of claim 10, wherein the eighth side member of the third fastening member has a second fastening part to lock with the base board.

12. The fastening device of claim 6, wherein the third fastening member has a second opening.

13. The fastening device of claim 12, wherein the fourth side member of the second fastening member has a first fastening part to lock with the base board.

14. The fastening device of claim 13, wherein the eighth side member of the third fastening member has a second fastening part to lock with the base board.

15. A heat-dissipating module for dissipating a heat from an electronic component on a base board, the base board having a first surface, a second surface, and at least two holes, the heat-dissipating module comprising:

a fan for dissipating the heat;

a heat sink set on the electronic component;

a heat pipe welded on the heat sink for conducting the heat to the fan; and a fastening device comprising:

a first fastening member having at least four first engaging parts, the first fastening member being disposed on the first surface, each of the first engaging parts being embedded into the corresponding hole on the base board and being exposed out of the second surface;

a second fastening member disposed on the second surface, the second fastening member having a first side member, a second side member adjacent to the first side member, a third side member opposite to the second side member, and a fourth side member opposite to the first side member, the first side member having at least two second engaging parts engaged with the corresponding first engaging parts, the second side member having a first pivoting hole, the third side member having a second pivoting hole; and a third fastening member disposed on the second surface, the third fastening member having a fifth side member, a sixth side member adjacent to the fifth side member, a seventh side member opposite to the sixth side member, and an eighth side member opposite to the fifth side member, the fifth side member having at least two third engaging parts engaged with the corresponding first engaging parts, the sixth side member having a first pivoting axle pivoted with the first pivoting hole, the seventh side member having a second pivoting axle pivoted with the second pivoting hole;

wherein when the second fastening member engages with the corresponding first engaging parts via the second engaging parts, and the third fastening member engages with the corresponding first engaging parts via the third engaging parts, both the fourth side member of the second fastening member and the eighth side member of the third fastening member press the heat sink.

16. The heat-dissipating module of claim 15, wherein the second fastening member has a first opening.

17. The heat-dissipating module of claim 16, wherein the third fastening member crosses the first opening of the second fastening member to pivot with the second fastening member in an X type.

18. The heat-dissipating module of claim 17, wherein the fourth side member of the second fastening member has a stopping part, the stopping part limits the rotation of the third fastening member.

19. The heat-dissipating module of claim 18, wherein the fourth side member of the second fastening member has a first fastening part to lock with the base board.

20. The heat-dissipating module of claim 19, wherein the eighth side member of the third fastening member has a second fastening part to lock with the base board.

* * * * *